United States Patent [19]

Shimada et al.

[11] Patent Number: 5,348,902
[45] Date of Patent: Sep. 20, 1994

[54] METHOD OF DESIGNING CELLS APPLICABLE TO DIFFERENT DESIGN AUTOMATION SYSTEMS

[75] Inventors: Shigeru Shimada, Hoya; Ryuji Shibata, Higashiyamato, both of Japan; Atsushi Kurosawa, San Jose, Calif.

[73] Assignees: Hitachi, Ltd., Tokyo, Japan; VSLI Technology Incorporated, San Jose, Calif.

[21] Appl. No.: 5,998

[22] Filed: Jan. 19, 1993

[30] Foreign Application Priority Data

Jan. 21, 1992 [JP] Japan .................................. 4-031563

[51] Int. Cl.$^5$ .................................. H01L 21/70
[52] U.S. Cl. .................................. 437/51; 364/491
[58] Field of Search .................. 437/51; 364/491; 307/465.1

[56] References Cited

U.S. PATENT DOCUMENTS 5,124,273 6/1992 Minami .................................. 437/51

FOREIGN PATENT DOCUMENTS 0126525 11/1984 European Pat. Off. .

*Primary Examiner*—Tom Thomas
*Attorney, Agent, or Firm*—Fay, Sharpe, Beall, Fagan, Minnich & McKee

[57] ABSTRACT

In a method of designing cells applicable to different first and second design automation systems, first and second cells circuit-designed by the first and second design automation systems, respectively, are demarcated into a logic function portion and an input/output portion. A plurality of sets of common lithography patterns for the logic function portions of the first and second cells are determined such that each common lithography pattern set is shared by those of the first and second cells which have same logic function in the first and second design automation systems. A first set of lithography patterns for the input/output portions of the first cells in the first design automation system and a second set of lithography patterns for the input/output portions of the second cells in the second design automation system are determined, respectively. The first and second sets of lithography patterns are, at their external ends, in an arrangement satisfying requirements of the first and second design automation systems, respectively. The logic function portion of one or more of the first cells in the first design automation system having the determined set of common lithography pattern is combined with the input/output portion of the second cells having the second set of lithography pattern in the second design automation system.

8 Claims, 11 Drawing Sheets

METHOD OF DESIGNING CELLS APPLICABLE TO DIFFERENT DESIGN AUTOMATION SYSTEMS

BACKGROUND OF THE INVENTION

The present invention relates to a method of designing cells applicable to different design automation (DA) systems, a method of fabricating a semiconductor integrated circuit using a cell library developed by the particular cell-designing method, and a technique effectively applicable to the designing of a basic cell utilized for, for example, the standard cell system.

In an automatic placing and routing system for fabricating a semiconductor integrated circuit device (hereinafter sometimes referred to simply as "LSI device"), cells are placed and routed between terminals on a semiconductor substrate. The cells include basic cells of a standard cell system or a cell-based system, and are registered in a library as a functional block of, for example, a flip-flop or a two-input NAND gate. The layout of these cells is prepared through an automatic cell layout preparation program on the basis of a circuit diagram designed in advance. This automatic cell layout preparation program is for generating an actual cell pattern on the basis of circuit diagram information, a layout rule on the fabrication process of the LSI device and performance designating information such as the width and length (W/L) of the transistor.

Design automation (DA) systems for automatic placing and routing of basic cells include those marketed by various computer-aided design (CAD) system makers and those internally fabricated by semiconductor integrated circuit device makers. Individual DA systems, however, are required to meet the input/output terminal requirements specific thereto. The input/output requirements constitute conditions to be met for connecting cells to each other and relate to the layout pitch, layout level and the material of the conductors for external connection of cells. In the case where different DA systems are used for the same functional block, for example, as shown in FIG. 1, the input/output conditions are that the minimum layout pitch of the conductor is 2.8 $\mu$m with the material and the layout level of the conductor met by a second-layer aluminum conductor AL2 for one DA system, and that the minimum conductor layout pitch is 3.4 $\mu$m with the material and layout level of the conductor met by a polysilicon conductor POLS and a second-layer aluminum conductor AL2 for another DA system. Therefore, the input/output terminals requirements of these two materials have nothing in common and are incompatible with each other.

As shown in FIG. 2, the steps for producing a library of basic cells include logic designing 10, circuit designing 11, pattern designing 12, production of a delay library 13, and registration 14 of the data obtained in the foregoing steps. In the logic designing step 10, the kind of gate function to be developed for a cell is studied, and the logics designed to realize the particular function. Generally, substantially the same function of a standard cell is required for different DA systems, and the currently-available logics may be used for the same purpose, thus requiring substantially no designing. The circuit designing step 11 is for designing a circuit to realize a required logics with an MOS transistor, for example. This step may also utilize a currently-available circuit as in the logics designing and requires not so many designing processes. The pattern designing step 12 is for designing a layout for realizing a MOS transistor circuit as a pattern on the wafer. As to the number of designing processes for this step, the redesigning is necessary for each generation of the process used, and the designing of a cell library accounts for a major proportion. Also, different DA systems are required to meet different conditions for connection (input/output terminal requirements) of the cell input/output portions, thus making necessary a pattern designing for each DA system. In the delay library preparation 13, a delay constant is determined by circuit simulation. This step requires designing processes more than the logics designing or circuit designing but less than the pattern designing. In this way, the greatest portion of the designing processes relating to cell library development consists of cell pattern designing required to be developed for each automatic placing and routing system (hereinafter referred to simply as "DA system").

Some DA systems are good at cell placing and routing for fabrication of a large-scale logic circuit device, and other DA systems are suitable for cell placing and routing only for fabricating a small-scale logic circuit device. Still other DA systems are capable of designing an IC (ASIC) for special applications within a short period of time. In many cases, therefore, the same semiconductor maker uses a plurality of DA systems for designing integrated circuits. In such a case, independent development of a standard cell library for each DA system is a double investment of designing resources. The turn-around time for development of the cell library would be lengthened in such a field as ASIC where the important key for creating customers is to develop and supply a cell library to the market as fast as possible.

SUMMARY OF THE INVENTION

An object of the present invention is to provide a method of designing cells which is capable of contributing to early development of a cell library for mutually different DA systems.

Another object of the present invention is to provide a method of designing cells by a DA system which is capable of effectively using the cell information of the cell library of another DA system having a different connection and routing requirement for the input/output terminals of cells.

Still another object of the present invention is to provide a method of fabricating a semiconductor integrated circuit device using the above-mentioned method of designing cells.

In a method of designing cells applicable to different first and second design automation systems according to one aspect of the present invention, first and second cells circuit-designed by the first and second design automation systems, respectively, are demarcated into a logic function portion and an input/output portion. The logic function portion of a cell is responsible for a logic function of the cell defined by the circuit design and the input/output portion of the cell is responsible for an arrangement of input/output conductors of the cell for electrical connection. A plurality of sets of common lithography patterns for the logic function portions of the first and second cells are determined such that each common lithography pattern set is shared by those of the first and second cells which have the same logic function in the first and second design automation systems. A first set of lithography patterns for the input/output portions of the first cells in the first design automation system and a second set of lithography patterns for the input/output portions of the second cells in the second design automation system are determined, respectively. The first and second sets of lithography patterns are, at their external ends, in an arrangement satisfying requirements of the first and second design automation systems, respectively. The logic function portion of one or more of the first cells in the first design automation system having the determined set of common lithography pattern is combined with the input/output portion of the second cells having the second set of lithography pattern in the second design automation system.

According to another aspect of the present invention, cells corresponding to a plurality of DA systems are demarcated into a logic function definition area constituting a logic function portion defining a required logic function and a connection conductor arrangement definition area making up an input/output terminal portion for connecting a cell to an external unit. In cells applicable to the first and second DA systems, for example, the logic function portions of the cells having the same logic function are designed with the same pattern to determine a common pattern, so that the external end of an input/output pattern of the cell of the first DA system has an input/output conductor arrangement, i.e., a conductor layout level and a layout pitch satisfying the input/output terminal requirements of the first DA system, and the external end of the cell of the second DA system has an input/output conductor arrangement, i.e., a conductor layout level and a layout pitch satisfying the input/output terminal requirements of the second DA system. In order to make cells having the same logic function applicable to a plurality of DA systems, a cell pattern is designed in such a manner that the input/output portion of a cell is replaced for each DA system, and that a logic function portion is shared by different DA systems, thereby reducing the number of steps of pattern designing for developing the cell library of a DA system. The layout pitch of the input/output conductors at the internal end of the cell input/output portion, therefore, is consistent with that of the conductors of the logic function portion.

In the case where the layout level of the input/output conductor at the internal end of the cell input/output portion is different from that of the conductor of the logic function portion, a connector like a through hole for connecting the conductors at different levels to each other is defined in the input/output portion.

According to still another aspect of the present invention, the input/output portion (connection conductor arrangement definition area) of the cell in a given DA system having specific input/output terminal requirements has added thereto a definition area for connection conductor arrangement conversion of a different DA system thereby to design a cell applicable to the particular different DA system. A connector like the above-mentioned through hole may be defined also in this definition area for connection conductor arrangement conversion.

More specifically, the internal end of the pattern of the cell input/output portion of a second DA system is arranged in such a manner as to satisfy the input/output requirements of a first DA system, while the cell input/output portion of the second DA system is added to one or more cells of the first DA system.

A cell with a pattern designed by the above-mentioned method is regarded as a basic cell of a standard cell system of a semiconductor integrated circuit and is registered in the library. A multiplicity of cells registered in the library are placed and routed in order to constitute a semiconductor integrated circuit device as required, and mask patterns are formed from information thus obtained. These masks are used for forming a semiconductor integrated circuit device on a semiconductor substrate.

The technique of substituting a connection conductor arrangement definition area making up a cell input/output portion or adding a definition area for connection conductor arrangement conversion to a connection conductor arrangement definition area is based on the sharing of an area for defining the logic function (logic function portion) of a cell, whereby a currently-available cell library is made usable also for cell pattern designing of another DA system. This makes it possible to develop a library applicable to a plurality of DA systems within a short period of time simply by designing an input/output portion satisfying the input/output terminal requirements of a DA system with the number of designing steps unchanged for developing the cell library of another DA system.

BRIEF DESCRIPTION OF TEE DRAWINGS

DESCRIPTION OF THE PREFERRED EMBODIMENTS

Figure 2:
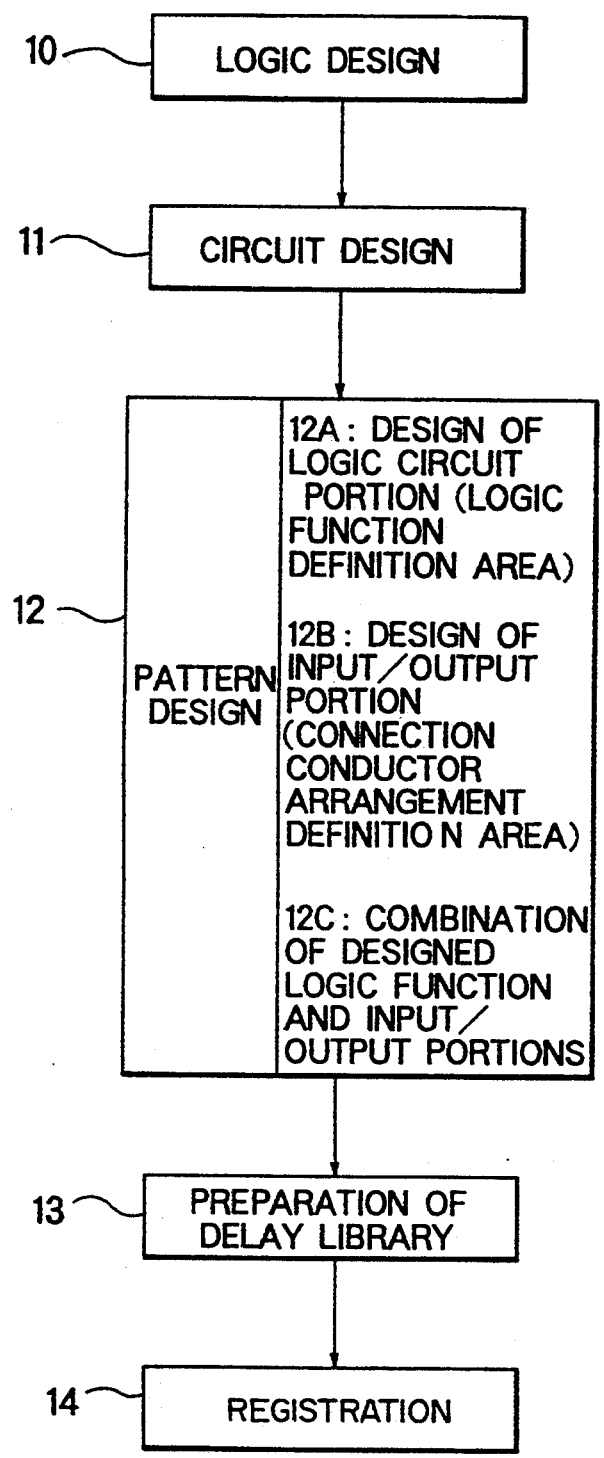
FIG. 2 is a flowchart showing the procedure for cell development using a cell-designing method according to an embodiment of the present invention.

The procedure for developing a cell library according to an embodiment of the present invention is shown in FIG. 2.

Figure 5:
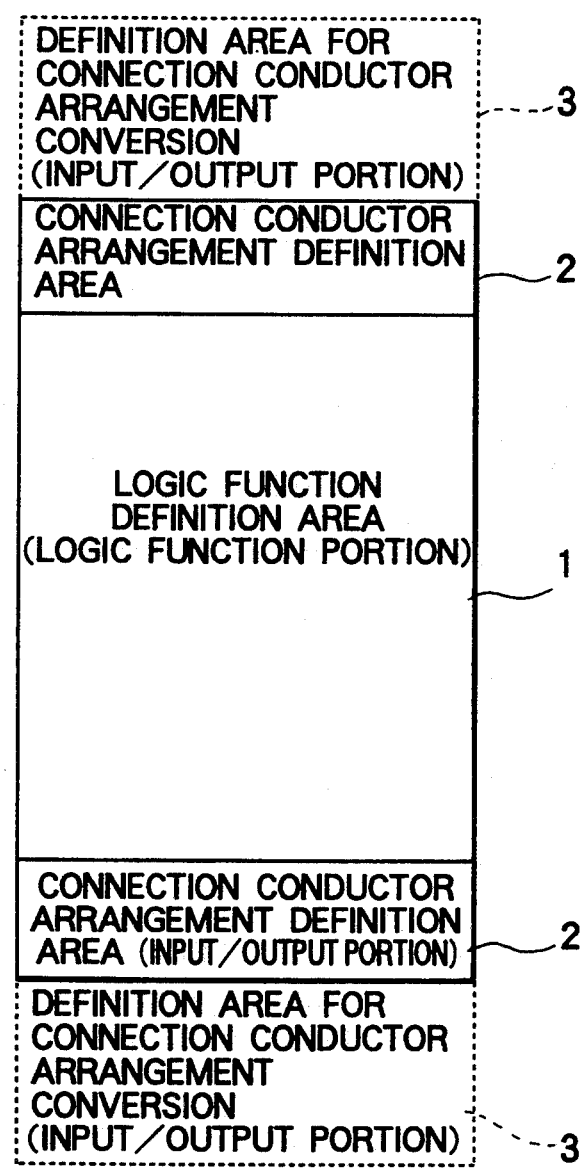
FIG. 5 is a diagram for explaining an example of the relationship between the logic function definition area, the connection conductor arrangement definition area and the definition area for connection conductor arrangement conversion.

A cell library (cell) is developed through the steps of logic designing 10, circuit designing 11, pattern designing 12, preparation of delay library 13 and registration 14. In the logic designing step 10, as described above, the logic function of a given cell to be developed is studied, and the logics for realizing such a function is designed. In the circuit designing step 11, as explained above, a circuit is designed for realizing the logics with a MOS transistor, for example. The pattern designing step 12 is for designing a layout to realize a MOS transistor circuit as a pattern on the wafer. Conventionally, different placing and routing systems such as DA systems are accompanied by different input/output terminal requirements of a cell. The delay library creation step 13 is for determining a delay constant of a cell by circuit simulation. In the cell development according to the present embodiment, the technique of pattern designing is different from the conventional technique in that according to the embodiment under consideration, a cell is demarcated into a logic function portion and an input/output portion, and includes the three substeps of designing a pattern for the logic function portion independent of the DA system, designing a pattern for the input/output portion dependent on the DA system and combining the two patterns. As shown in FIG. 5, the logic function portion designed by this pattern designing technique is equivalent to the logic function definition area of the cell, and the input/output portion to the connection conductor arrangement definition area 2. The input/output terminal requirements specific to the DA system are applied to this connection conductor arrangement definition area 2. The input/output terminal requirements relate to the arrangement (layout) of conductors for external connection and layout level and material of a cell. The logic function definition area 1 and the connection conductor arrangement definition area 2 which were combined to develop a cell pattern data may be either of a hierarchal structure with the data thereof separable or of a simple structure without any hierarchal characteristics.

Figure 3:
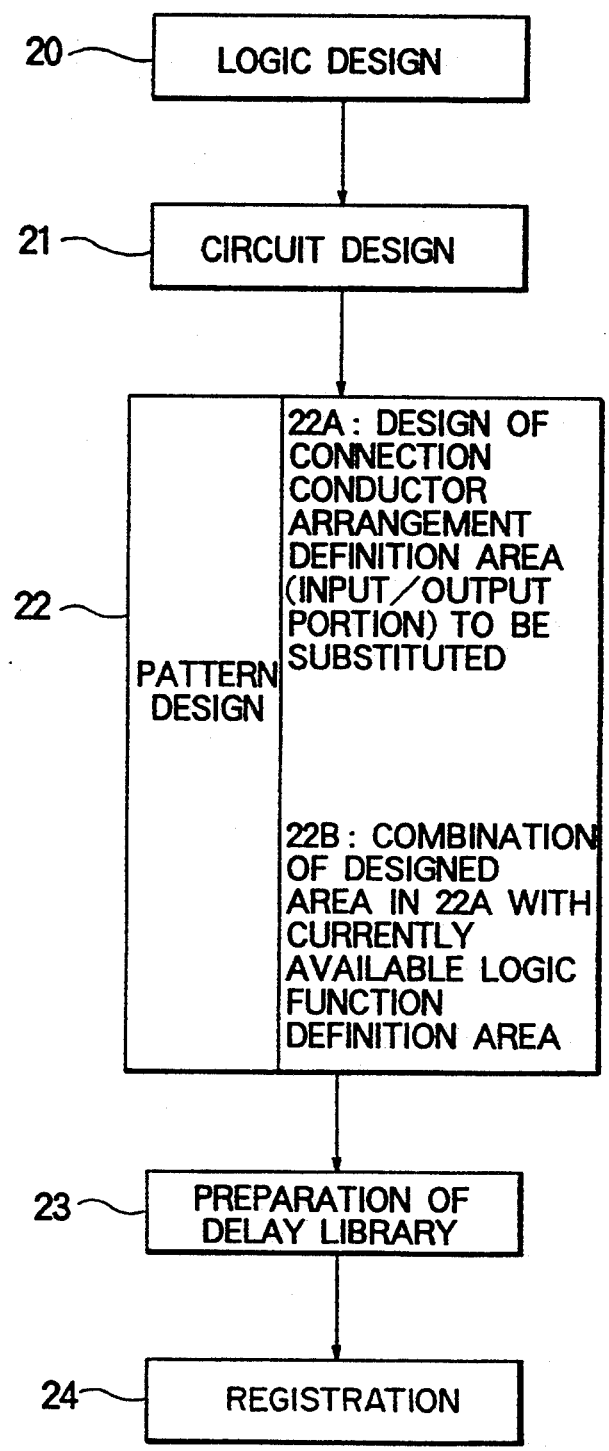
FIG. 3 is a flowchart showing the procedure for development of a cell applicable to another DA system by replacing the connection conductor arrangement definition area (input/output portion) according to an embodiment of the present invention.

FIG. 3 shows a procedure for developing a cell library applicable to another DA system by substituting the connection conductor arrangement definition area (input/output portion). The steps 20, 21, 23 and 24 are similar to the steps 10, 11, 13 and 14 shown in FIG. 2, respectively.

In the step 22 of designing a cell pattern, the logic function definition area (logic function portion) 1 of a cell having the intended logic function is used from a currently-available cell library, the input/output portion (connection conductor arrangement definition area) 2 satisfying the input/output terminal requirements of another DA system used for development of the cell library is newly designed, and the newly-designed input/output portion 2 and the currently-available logic function portion 1 are combined into a new cell pattern. In the case where the data structure of the currently-available cell is not hierarchal, the connection conductor arrangement definition area 2 is removed from the cell to be used and the logic function definition area 1 is cut out. According to this technique of pattern designing, once the connection conductor arrangement definition area 2 satisfying the applicable connection conductor arrangement requirements is designed, a cell library already developed by the technique shown in FIG. 2 may be used, thereby reducing the number of designing steps for developing a new cell library.

Figure 4:
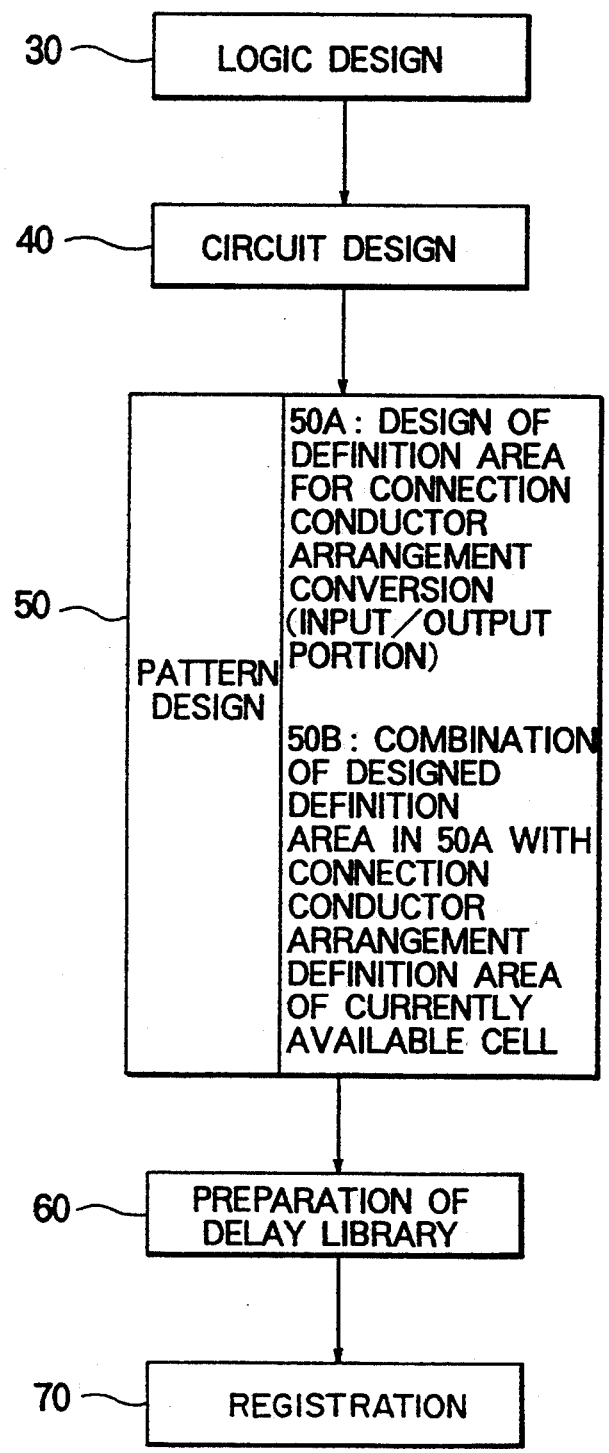
FIG. 4 is a flowchart showing the procedure for developing a cell applicable to another DA system by adding the definition area for connection conductor arrangement conversion (input/output portion) to a currently-available cell in a given DA system.

The procedure for developing a cell applicable to a given DA system by attaching a definition area for connection conductor arrangement conversion to a currently-available cell in another DA system is shown in FIG. 4.

According to this procedure, a cell pattern is designed by adding the definition area for connection conductor arrangement conversion (input/output portion) 3 shown in FIG. 5 to the connection conductor arrangement definition area (input/output portion) 2 of a cell having the intended logic function in a currently-available cell library. This definition area for connection conductor arrangement conversion (input/output portion) 3 is such that the input/output portion of a currently-available cell meets the input/output terminal requirements of the DA system used for development of a cell library. According to this pattern designing technique, a cell in a currently-available cell library in a given DA system can be used as it is, to the extent that the definition area for connection conductor arrangement conversion (input/output portion) 3 satisfying predetermined input/output terminal requirements of another DA system is designed, thereby reducing the number of design steps for cell development.

Figure 6:
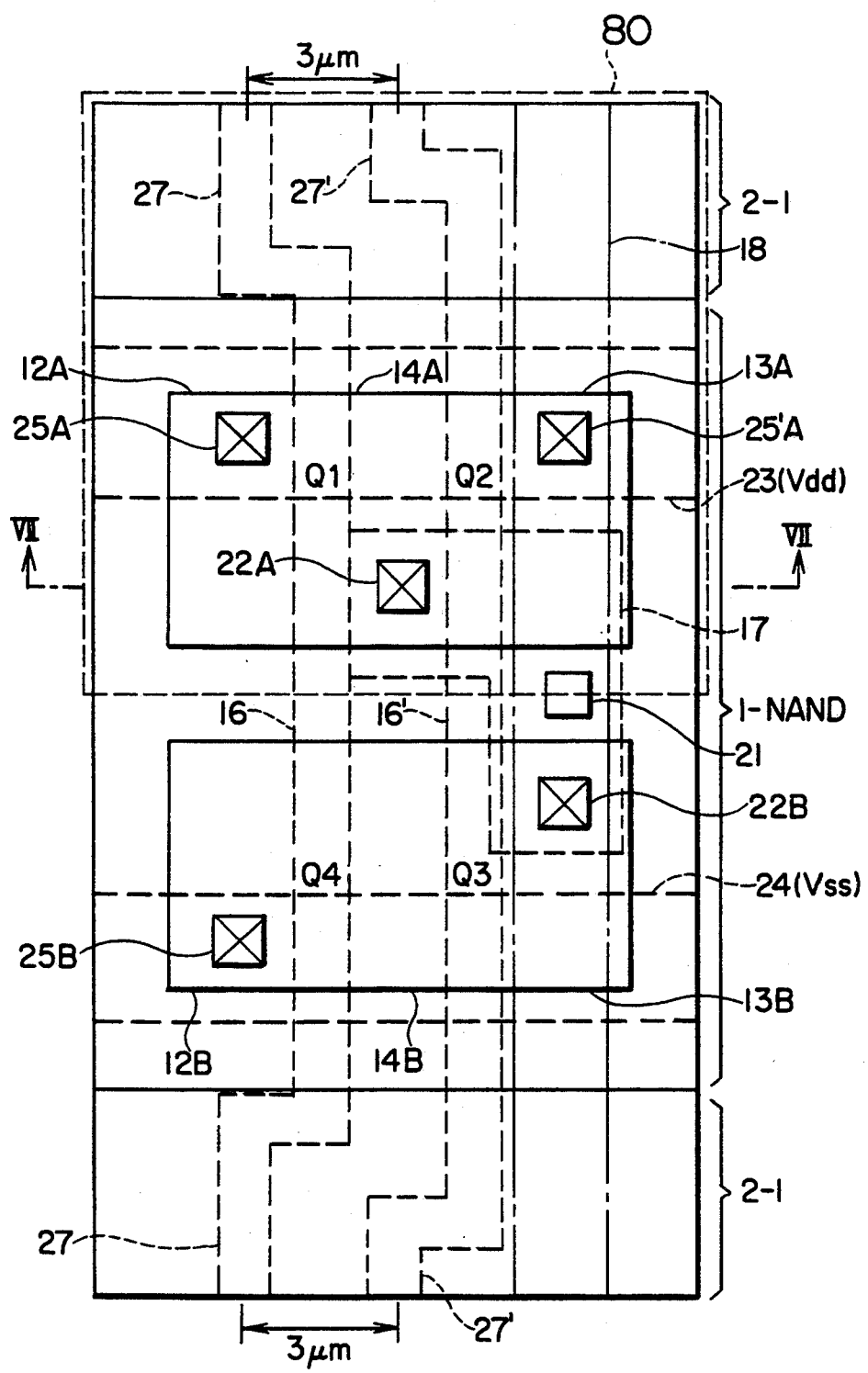
FIG. 6 is a plan view showing an example of a cell with a pattern designed by the method shown in FIG. 1.
Figure 7:
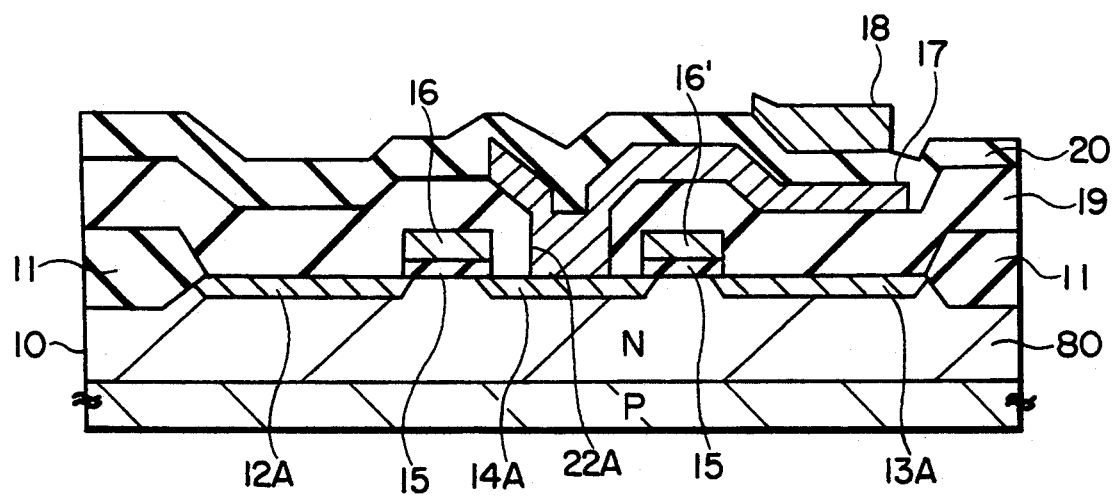
FIG. 7 is a sectional view taken in the line VII—VII in FIG. 6.

A plan view of an example of a cell with the pattern thereof designed by the method of FIG. 2 is shown in FIG. 6, and a sectional view taken in the line VII—VII of FIG. 6 in FIG. 7.

The cell shown in FIG. 6 is designed using a first DA system, and constitutes, though not specifically limited, a two-input NAND gate circuit applied to a standard cell system. As seen from an equivalent circuit shown in FIG. 8, this two-input NAND gate circuit includes two P-channel MOS transistors Q1, Q2 with the sources thereof connected to a power conductor Vdd and the drains thereof connected to a common point, and two N-channel MOS transistors Q3, Q4 arranged in series between the common drain of the MOS transistors Q1, Q2 and the grounding conductor Vss. The gate shared by the MOS transistors Q1 and Q4 makes up one input IN1, the gate shared by the MOS transistors Q2 and Q3 the other input IN2, and the drain shared by the MOS transistors Q1 and Q2 an output OUT.

Figure 1:
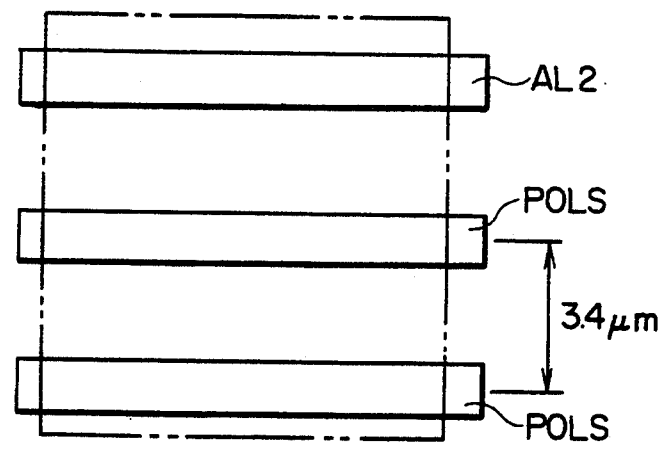
FIG. 1 is a diagram for explaining an example of difference in the input/output terminal requirements based on the difference in the DA system.
Figure 1:
Figure 1:
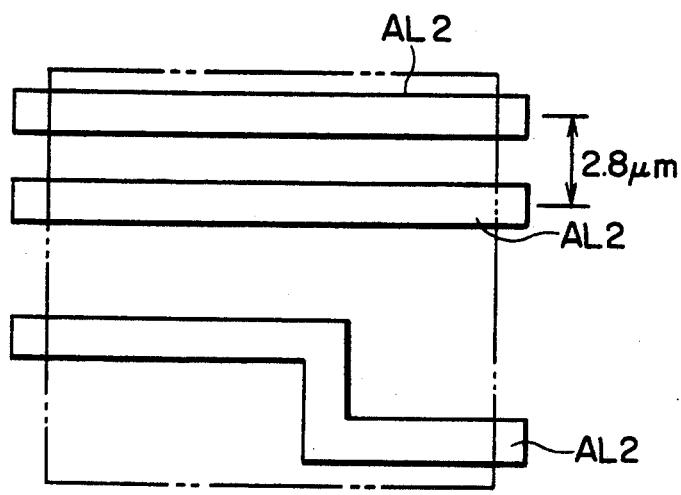
Figure 8:
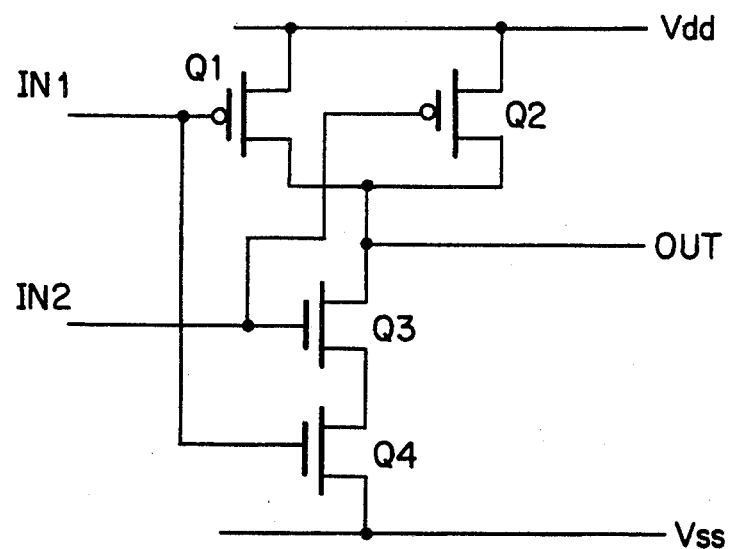
FIG. 8 shows an equivalent circuit of the two-input NAND gate shown in FIG. 6.

In FIG. 6, 1-NAND designates a lithography pattern for the logic function definition area (logic function portion) 1 having a logic function of a two-input NAND gate shown as an equivalent circuit in FIG. 8, and 2-1 a lithography pattern for the connection conductor arrangement definitions area (input/output portion) 2 satisfying the input/output terminal requirements of a first DA system. The input/output terminal requirements of the first DA system are, for example, that two polysilicon connecting conductors 27, 27' making up a first level and a second-layer aluminum connecting conductor 18 constituting a third level are used as a conductor for connecting with an external unit of a cell, and the layout pitch (DA pitch) for external connection is set to 3 microns. In FIGS. 6 and 7, the layout patterns of masks, etc. for forming a well diffusion layer or a diffusion layer are not shown for facilitating the understanding.

In FIGS. 6 and 7, reference numeral 10 designates a P-type silicon substrate, numeral 80 an N-type well, numeral 11 a field oxide film, numerals 12A, 12B, 13A, 13B diffusion regions for connecting to a power supply, numeral 14A a diffusion region for a NAND gate output, numeral 15 a gate oxide film of a MOS transistor, numerals 16, 16' a polysilicon conductor making up the gate of a MOS transistor, numeral 17 an aluminum connecting conductor for the first level conducted to the diffusion region 14A of the NAND gate output, numeral 18 a second-level aluminum connecting conductor for external cell connection, numeral 19 an interlevel insulating film between the first and second levels, numeral 21 a through hole as an opening for connecting the first-level aluminum connecting conductor 17 and the second-level aluminum connecting conductor 18, numerals 22A, 22B contact holes for connecting the diffusion region 14A or 13B and the first-level aluminum connecting conductor 17, numeral 23 a first-level aluminum conductor making up a power conductor Vdd, numeral 24 a second-level aluminum conductor making up a grounding conductor Vss, numerals 25A, 25'A, 25B contact holes for connecting the diffusion regions 12A, 13A, 12B and the power conductor Vdd (23) or the grounding conductor Vss (24), and numerals 27, 27' polysilicon conductors for external connection integrated with the polysilicon conductors 16, 16' making up the gates of the transistors Q1 to Q4.

In the pattern 2-1 shown in FIG. 6, the external connection conductors of a cell include two polysilicon conductors 27, 27' made of the same material as the polysilion making up the gate electrode of the MOS transistor and the second-level aluminum conductor 18 connected through the first-level aluminum conductor 17 and the through hole 21 to the output diffusion layer 14A of the NAND gate. In this pattern 2-1, the poly-silicon conductors 27, 27' are bent in such a manner as to match the 3-micron DA pitch in accordance with the input/output terminal requirements of the first DA system.

Figure 9:
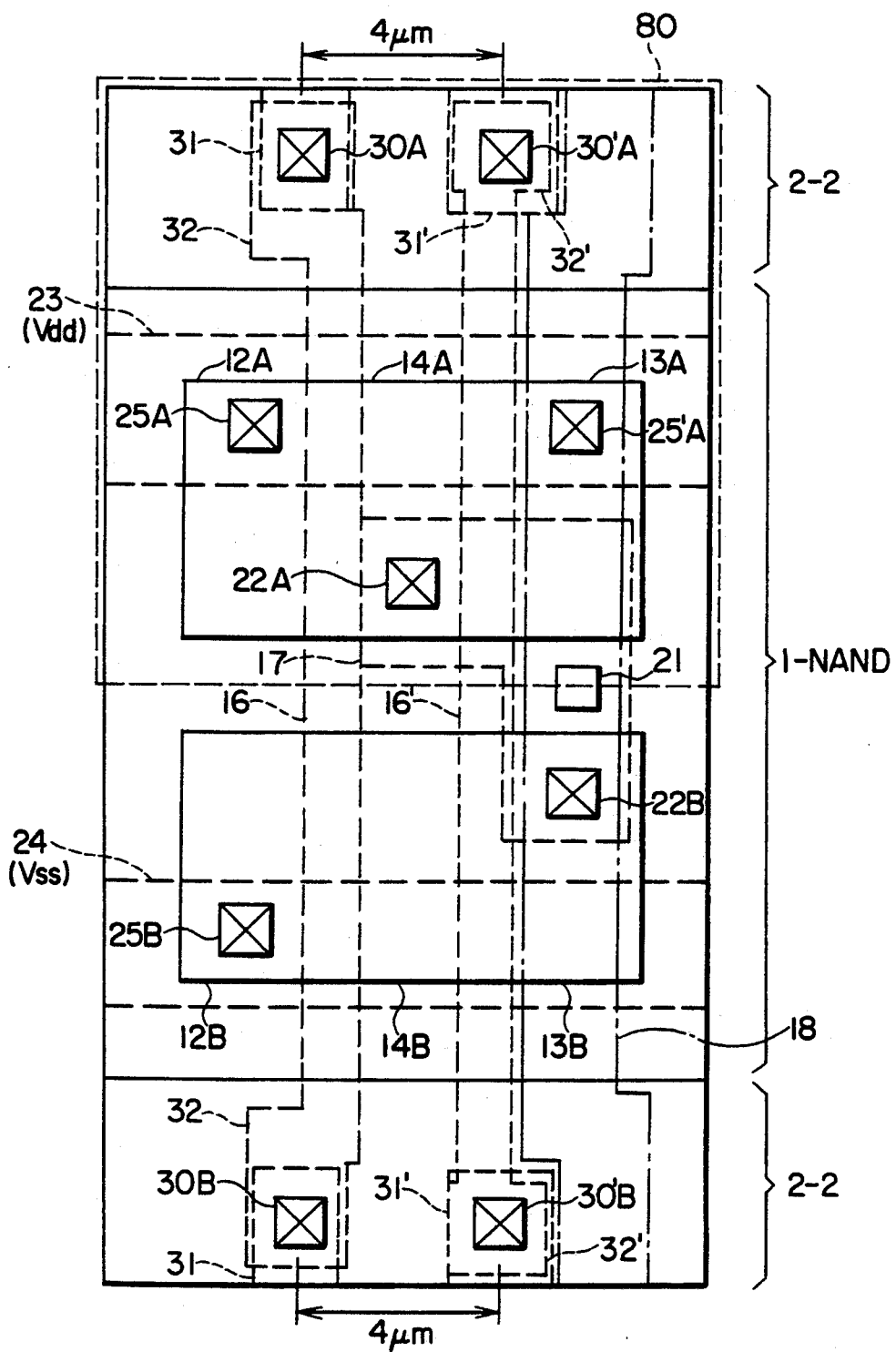
FIG. 9 is a plan view showing an example of a cell with a pattern designed by the method shown in FIG. 3.

FIG. 9 is a plan view showing an example of a cell with the pattern designed by the method shown in FIG. 3. The cell shown in FIG. 9 is one for a two-input NAND gate applicable to a second DA system different from the first DA system, and is designed by application of the pattern for the logic function portion designed using the first DA system shown in FIG. 6.

In FIG. 9, a set of patterns 1-NAND is identical to the one shown in FIG. 6. Numeral 2-2 designates a lithography pattern for the connection conductor arrangement definition area (input/output portion) 2 applicable to the second DA system. The cell pattern shown in FIG. 9 is obtained by substituting the pattern 2-2 for the pattern 2-1 in the cell pattern shown in FIG. 6. The input/output terminal requirements for the second DA system are, for example, that two first-level aluminum conductors making up the second-level conductor and one second-level aluminum conductor making up the third-level conductor are used as connecting conductors, and the layout pitch (DA pitch) for external connection is 4 microns. In the pattern 2-2 of FIG. 9, therefore, the external connection conductors of the cell include the first-level aluminum conductors 31, 31' connected through the contact holes 30A, 30'A, 30B, 30'B to the polysilicon conductors 16, 16' for connecting the gate of the MOS transistor, and the second-level aluminum conductor 18 connected through the first-level aluminum conductor 17 and the through hole 21 to the output diffusion layer 14A of the NAND gate. In this pattern 2-2, the two polysilicon conductors 32, 32' integrated with the polysilicon conductors 16, 16' making up the gates of the transistors Q1 to Q4 connected to the first-level aluminum conductor 31 through the contact holes 30A, 30'A, 30B, 30'B are bent in such a manner as to match the 4-micron DA pitch in accordance with the input/output terminal requirements of the second DA system.

In developing a cell library (cell) using a second DA system by application of the cell library developed from a first DA system, the same logic function portion 1 representing the greater proportion of the numbers of pattern designing steps is usable for the two DA systems. It is, therefore, not necessary to design each cell completely independently in accordance with each DA system unlike in the prior art.

Figure 10:
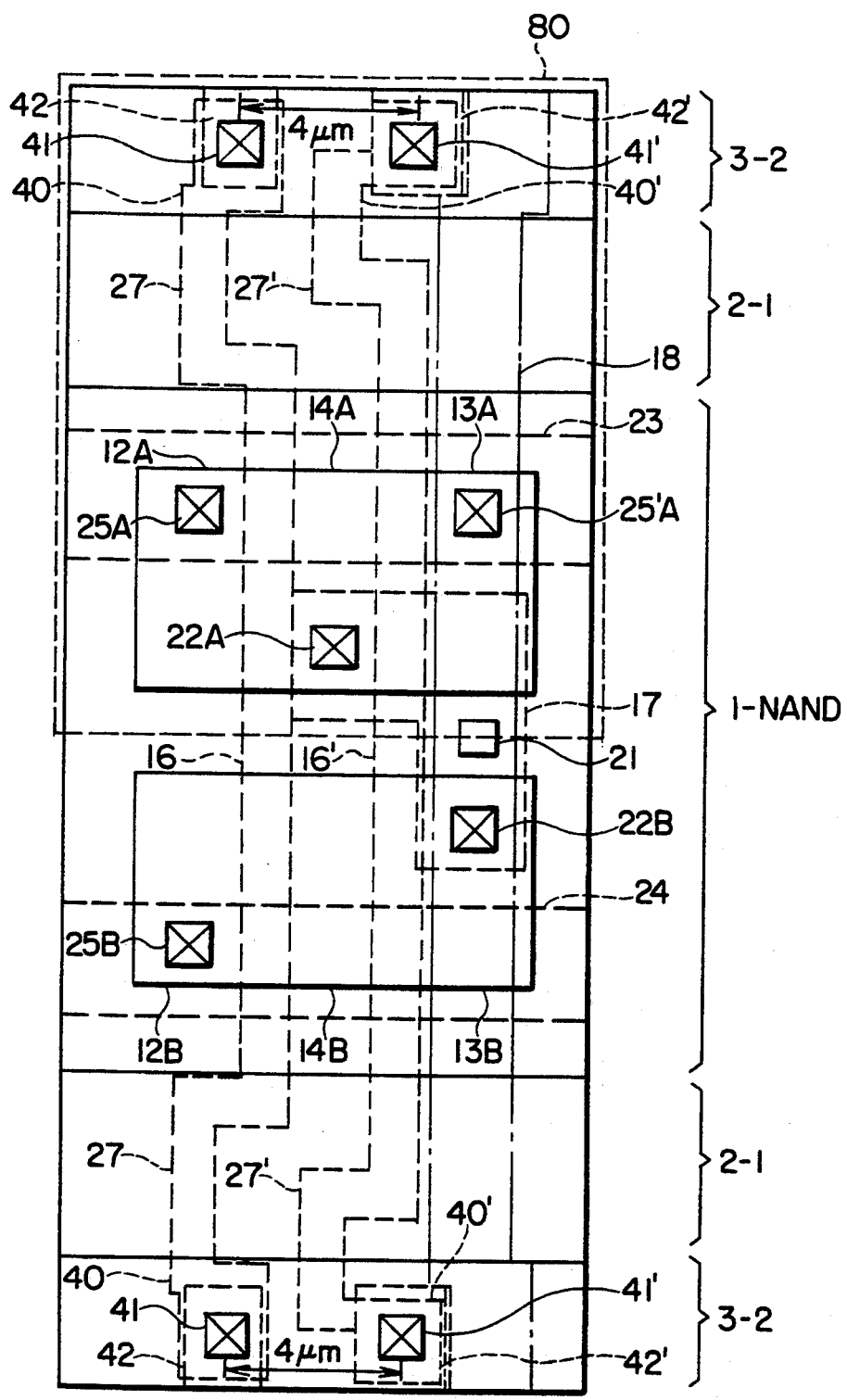
FIG. 10 is a plan view showing an example of a cell with a pattern designed by the method shown in FIG. 4.

A plan view of an example of cell with a pattern designed by the method of FIG. 4 is shown in FIG. 10. The cell shown in FIG. 10 is one for a two-input NAND gate applicable to the second DA system different from the first DA system, and is designed by application of a pattern for the logic function portion designed by use of the first DA system shown in FIG. 6.

In FIG. 10, sets of patterns 1-NAND and 2-1 are the same as the corresponding pattern sets shown in FIG. 6. Numeral 3-2 designates a lithography pattern for the definition area for connection conductor arrangement conversion (input/output portion) 3 applicable to the second DA system. The cell pattern shown in FIG. 10 is obtained by attaching a pattern 3-2 to the cell pattern shown in FIG. 6. In the pattern 3-2 shown in FIG. 10, the externally-connected conductors of the cell include first-level aluminum conductors 42, 42' connected through contact holes 41, 41' to polysilicon conductors 40, 40' connected to the polysilicon conductors 27, 27' and a second-level aluminum conductor 18 connected through a first-level aluminum conductor 17 and a through hole 21 to the output diffusion layer of the NAND gate. Also in this pattern 3-2, the two polysilicon conductors 40, 40' connected to the first-level aluminum conductors 42, 42' are bent in such a fashion as to match the 4-micron DA pitch in accordance with the input/output terminal requirements of the second DA system.

According to this example, the whole cell shown in FIG. 6 is used as it is, and the level of the input/output portion and DA pitch are converted at the converter (input/output portion) 3-2 attached to the pattern 2-1. As a result, as in the above-mentioned embodiments, a cell library completely developed by use of one DA system is applicable easily to another DA system, thereby reducing the number of steps of designing a cell pattern remarkably as compared with the one required for new development, although the cell size is increased as compared with the one shown in FIG. 9. Especially in the case where the data structure of a cell pattern completely developed is not hierarchal with the logic function definition area 1 and the connection conductor arrangement definition area 2 inseparable from each other in terms of data, it is possible to remove the connection conductor arrangement definition area 2 from the particular data and thus to eliminate the procedure for cutting out the logic function definition area 1.

Figure 12:
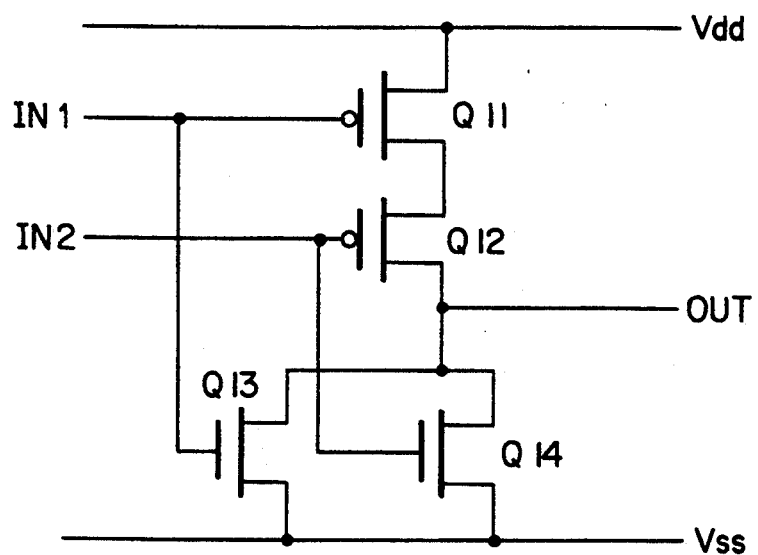
FIG. 12 is a diagram showing an equivalent circuit of the two-input NOR gate shown in FIG. 11.
Figure 11:
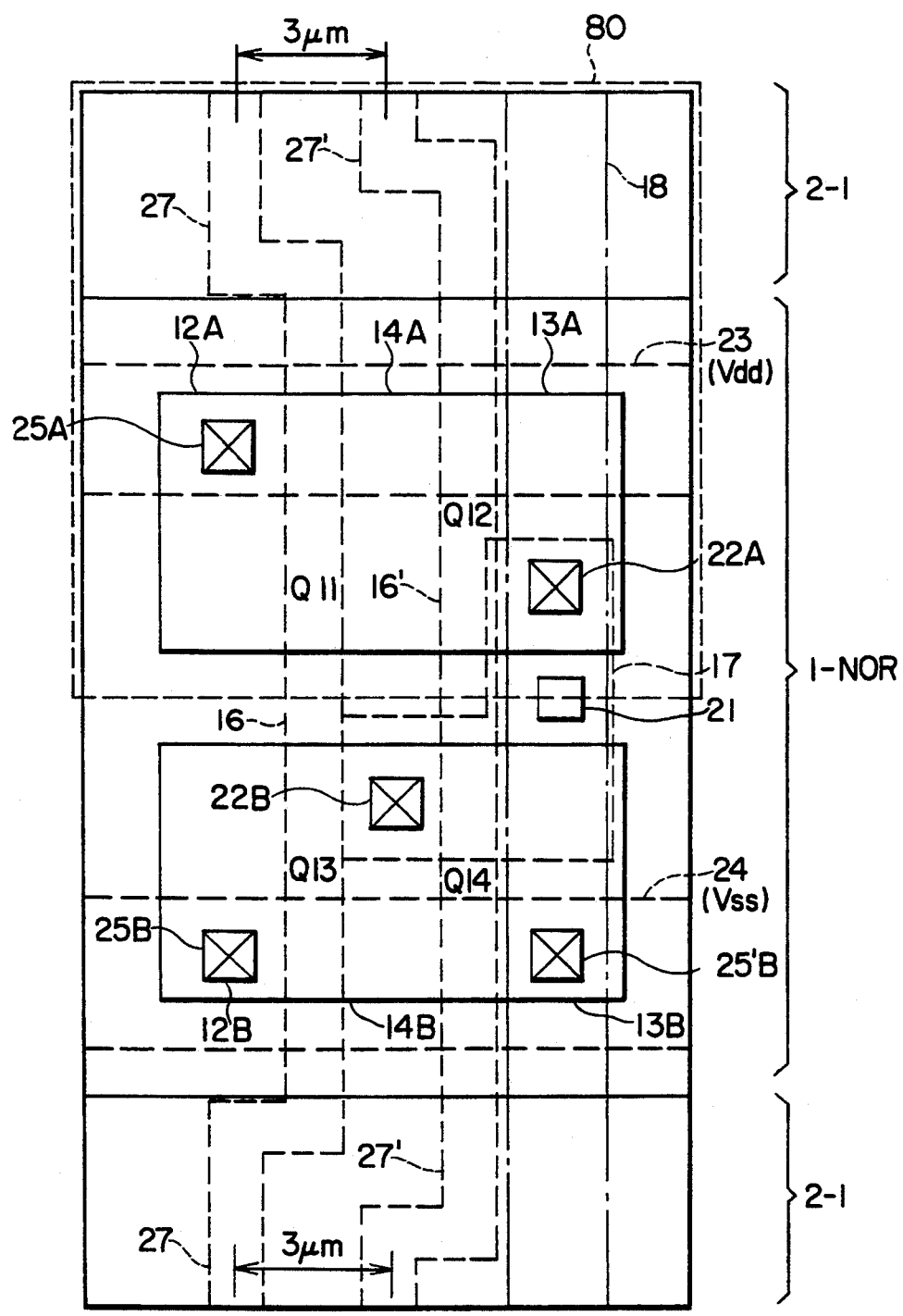
FIG. 11 is a plan view showing an example of a cell with a two-input NOR gate designed using the very pattern of the connection conductor arrangement definition area of a cell used with the two-input NAND gate shown in FIG. 6.

FIG. 11 shows an example in which a two-input NOR gate with an equivalent circuit thereof shown in FIG. 12 is designed by direct use of the pattern 2-1 of the connection conductor arrangement definition area 2 as an input/output portion of the cell used at the two-input NAND gate shown in FIG. 6. The pattern 1-NOR at the logic function portion defines a MOS transistor for constituting a two-input NOR gate. As represented by the two-input NAND gate and the two-input NOR gate (FIGS. 6 and 11), as far as a pattern is designed with a fixed level and layout pitch of the connection conductor pattern at a point connecting the logic function portion and the input/output portion for each of cells having the same number of input/output terminals, the same input/output terminal portion is usable for different logic function portions. To the extent that the patterns at the connector of the logic function portions and the input/output portions are designed by sharing logic function portions of a similar pattern topology such as a two-input NAND gate, NOR gate, OR gate or AND gate, therefore, a common pattern of the input/output portion is usable between the cells having different logic functions of the basic logic circuit. The number of input/output terminals to be designed is thus reduced as compared with that of cells to be developed. In this way, it is possible to further reduce the number of steps of designing a cell pattern.

A library entered with cells having a pattern designed by the above-mentioned method is applied to the automatic placing and routing by a predetermined DA system, whereby the data for forming a mask pattern of an intended semiconductor integrated circuit device is formed. On the basis of this data, a predetermined mask pattern is specified, and by utilizing a photomask or an electron beam plotter according to this pattern, a desired semiconductor integrated circuit device is fabricated on the wafer through the well-known various wafer processes. The resulting wafer is subjected to various tests including the wafer probe test, and only qualified chips are packaged after dicing.

The invention developed by the present inventor which has been explained specifically above with reference to embodiments is not limited to such embodiments, but may of course be modified appropriately without departing from the spirit of the present invention.

For example, the present invention is not limited to the NAND gate or NOR gate which has been described above as an example of logic function portion in the foregoing embodiments. Instead, the present invention may be configured of a cell having a larger logic scale such as a flip-flop and an arithmetic logic operator as well as various logic gates including an AND gate, an OR gate and an exclusive-NOR gate. The logic scale of a cell is not limited as far as it is within a range that can be grasped as a functional block. Also, the DA pitch and the number of metal conductor levels may be altered appropriately.

Apart from the field of utilization of the present invention developed by the present inventors explained above primarily with reference to the standard cell system, the present invention is applicable with equal effect to various design systems for a semiconductor integrated circuits.

The effects obtained in the embodiments described above will be briefly explained.

Specifically, a logic function portion defining the logic function of a cell is shared by various DA systems, and by employing the technique of substituting the input/output portion of a cell or adding a definition area for connection conductor arrangement conversion (other input/output portions) to the input/output portion, it becomes possible to apply the cell of a currently-available cell library developed by use of a DA system to a cell pattern designing developed by use of another DA system. As a result, it is possible to develop a cell library corresponding to a plurality of DA systems within a short period of time simply by designing a pattern of the input/output portion anew with the same number of steps of developing a cell library of a DA system.

Further, a pattern is designed by fixing the level and layout pitch of the pattern of the connection conductor for connecting the logic function portion and the input/output portion for each of the cells having the same number of input/output terminals, so that the same input/output portion is usable for different logic function portions. As a consequence, once the patterns in the connector between the logic function portion and the input/output portion is designed in such a manner that logic function portions including a two-input NAND gate, a NOR gate, an OR gate and an AND gate in a similar topology have a common pattern, then the same input/output portion may be shared by cells having different logic functions Of the logic function portion. Thus the number of input/output portions to be designed is reduced as compared with that of the cells to be developed, with the result that the number of steps of designing a cell pattern is further reduced.

We claim:

1. A method of designing first and second cells applicable to different first and second design automation systems as a part of a circuit design, comprising:
    preparing the first cells circuit-designed by the first design automation system and the second cells circuit-designed by the second design automation system;
    demarcating each of said first and second cells into a logic function portion and an input/output portion, wherein said logic function portion is responsible for a logic function of the circuit design and said input/output portion is responsible for an arrangement of input/output conductors for electrical connection of the circuit design;
    determining a plurality of sets of common lithography patterns for the logic function portions of said first and second cells such that each common lithography pattern set is shared by those of said first and second cells which have same logic function in said first and second design automation systems;
    determining a first set of lithography patterns for the input/output portions of said first cells in said first design automation system and a second set of lithography patterns for the input/output portions of said second cells in said second design automation system, respectively, such that said first and second sets of lithography patterns are, at their external ends, in an arrangement satisfying requirements of said first and second design automation systems, respectively; and
    combining the logic function portion of at least one of said first cells in said first design automation system having said determined set of common lithography pattern, with the input/output portion of said second cells having said second set of lithography pattern in said second design automation system.

2. A method according to claim 1, wherein
    said second set of lithography patterns for the input/output portions of the second cells is, at its internal end, in an arrangement consistent with an arrangement of an end of said common lithography pattern set for said logic function portion of said one first cell in said first design automation system, said combining step includes replacing an input/output portion of said one first cell in said first design automation system by said input/output portion of the second cells having said second set of lithography patterns in said second design automation system.

3. A method according to claim 2, wherein said replacing step includes extracting said logic function portion from said at least one first cell in said first design automation system and attaching said input/output portion of said second cells having said second set of lithography pattern in said second design automation system to said extracted logic function portion of the first cell in said first design automation system.

4. A method according to claim 1, wherein said arrangement of input/output conductors includes a layout pitch and layout levels of said input/output conductors.

5. A method according to claim 4, wherein said arrangement of input/output conductors further includes interconnection between input/output conductors of said input/output portions and connection conductors in said logic function portions at different levels.

6. A method of designing first and second cells applicable to different first and second design automation systems as a part of a circuit design, comprising:

preparing the first cells circuit-designed by the first design automation system and the second cells circuit-designed by second design automation system;

demarcating each of said first and second cells into a logic function portion and an input/output portion, wherein said logic function portion is responsible for a logic function defined by the circuit design and said input/output portion is responsible for an arrangement of input/output conductors for electrical connection with another cell;

determining a set of lithography patterns for the input/output portions of said second cells in said second design automation such that said set of lithography patterns is, at its external end, in an arrangement satisfying requirement of said second design automation system and is, at its internal end, in an arrangement satisfying requirement of said first design automation system, respectively; and attaching said input/output portion of said second cells having said determined set of lithography pattern in said second design automation system to at least one first cell in said first design automation system.

7. A method of designing first and second cells as a part of circuit design, comprising:

preparing the first and second cells for which the circuit design has been completed, said first and second cells having an identical number of input/output terminals;

demarcating each of said first and second cells into a logic function portion and an input/output portion, wherein said logic function portion is responsible for a logic function defined by the circuit design and said input/output portion is responsible for an arrangement of input/output conductors for electrical connection with another cell;

determining a common lithography pattern for an interface portion including adjoining parts of said logic function portion and said input/output portion of said first and second cells such that said common lithography pattern is shared by said first and second cells; and determining a set of lithography patterns for each of said logic function portions of said first and second cells.

8. A method of manufacturing a semiconductor integrated circuit device comprising the steps of:

placing and routing the first and second cells designed by the method defined by claim 1 to produce mask pattern information;

preparing mask patterns from said mask pattern information; and forming semiconductor devices in a semiconductor substrate by use of said mask patterns.

* * * * *